(12) United States Patent
Ahn et al.

(10) Patent No.: US 9,036,051 B2
(45) Date of Patent: May 19, 2015

(54) IMAGE PROCESSING APPARATUS AND INTERPOLATION METHOD OPERABLE TO CALCULATE A LUMINANCE AND INTERPOLATE COLOR BY ADJUSTING A SIGNAL OUTPUT FROM AT LEAST ONE LOW-LUMINANCE PIXEL AND AT LEAST ONE HIGH-LUMINANCE PIXEL

(75) Inventors: Jung Chak Ahn, Yongin-si (KR); Yun Tae Lee, Seoul (KR); Bum Suk Kim, Hwaseong-si (KR); Tae Chan Kim, Yongin-si (KR); Jung Hoon Jung, Hwaseong-si (KR); Tae Sub Jung, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 375 days.

(21) Appl. No.: 13/542,921

(22) Filed: Jul. 6, 2012

(65) Prior Publication Data

US 2013/0010162 A1 Jan. 10, 2013

(30) Foreign Application Priority Data

Jul. 8, 2011 (KR) ........................ 10-2011-0067980

(51) Int. Cl.
*H04N 5/235* (2006.01)
*H04N 9/04* (2006.01)
*H01L 27/146* (2006.01)
*H04N 5/355* (2011.01)

(52) U.S. Cl.
CPC .......... *H04N 9/045* (2013.01); *H01L 27/14603* (2013.01); *H04N 5/35563* (2013.01)

(58) Field of Classification Search
CPC ...................................... H04N 5/235
USPC ...................................... 348/229.1
See application file for complete search history.

(56) References Cited

U.S. PATENT DOCUMENTS

| 7,616,239 B2 * | 11/2009 | Ishihara et al. | 348/249 |
| 2006/0119726 A1 * | 6/2006 | Oda et al. | 348/315 |
| 2007/0076113 A1 * | 4/2007 | Tamaru et al. | 348/333.01 |
| 2007/0242148 A1 * | 10/2007 | Kawai | 348/311 |
| 2008/0062325 A1 | 3/2008 | Jang | |
| 2009/0251556 A1 | 10/2009 | Mabuchi | |
| 2011/0128435 A1 * | 6/2011 | Ikeda | 348/362 |

FOREIGN PATENT DOCUMENTS

| JP | 2007-047279 | 2/2007 |
| JP | 2009-273119 | 11/2009 |
| KR | 1020080022633 | 3/2008 |

* cited by examiner

*Primary Examiner* — Gary C Vieaux
(74) *Attorney, Agent, or Firm* — Myers Bigel Sibley & Sajovec, P.A.

(57) ABSTRACT

An image sensor, an image processing apparatus including the same and an interpolation method of the image processing apparatus are provided. The image sensor includes a plurality of pixels that include a low-luminance pixel including a first photoelectric conversion device that accumulates a charge less than a predetermined reference value and a high-luminance pixel including a second photoelectric conversion device that accumulates a charge more than the predetermined reference value. Interpolation is carried out giving more weight to the low-luminance pixel at low luminance and giving more weight to the high-luminance pixel at high luminance, so that a higher SNR is obtained.

18 Claims, 16 Drawing Sheets

| G | B | G | B | G | B |
|---|---|---|---|---|---|
| R | G | R | G | R | G |
| G | B | G | B | G | B |
| R | G | R | G | R | G |
| G | B | G | B | G | B |
| R | G | R | G | R | G |

FIG. 5A

|  | $C_1$ | $C_2$ | $C_3$ | $C_4$ | $C_5$ | $C_6$ | $\cdots$ | $C_m$ |
|---|---|---|---|---|---|---|---|---|
| $R_1$ | $P_{11}$ L | $P_{12}$ H | $P_{13}$ L | $P_{14}$ H | $P_{15}$ L | $P_{16}$ H | $\cdots$ | $P_{1m}$ |
| $R_2$ | $P_{21}$ H | $P_{22}$ L | $P_{23}$ H | $P_{24}$ L | $P_{25}$ H | $P_{26}$ L | $\cdots$ | $P_{2m}$ |
| $R_3$ | $P_{31}$ L | $P_{32}$ H | $P_{33}$ L | $P_{34}$ H | $P_{35}$ L | $P_{36}$ H | $\cdots$ | $P_{3m}$ |
| $R_4$ | $P_{41}$ H | $P_{42}$ L | $P_{43}$ H | $P_{44}$ L | $P_{45}$ H | $P_{46}$ L | $\cdots$ | $P_{4m}$ |
| $R_5$ | $P_{51}$ L | $P_{52}$ H | $P_{53}$ L | $P_{54}$ H | $P_{55}$ L | $P_{56}$ H | $\cdots$ | $P_{5m}$ |
| $R_6$ | $P_{61}$ H | $P_{62}$ L | $P_{63}$ H | $P_{64}$ L | $P_{65}$ H | $P_{66}$ L | $\cdots$ | $P_{6m}$ |
| $\vdots$ | $\vdots$ | $\vdots$ | $\vdots$ | $\vdots$ | $\vdots$ | $\vdots$ | $\cdots$ | $\vdots$ |
| $R_n$ | Pn1 | Pn2 | Pn3 | Pn4 | Pn5 | Pn6 | $\cdots$ | Pnm |

FIG. 5B

|     | $C_1$ | $C_2$ | $C_3$ | $C_4$ | $C_5$ | $C$ | ... | $C_m$ |
|-----|-------|-------|-------|-------|-------|-------|-----|-------|
| $R_1$ | $P_{11}$ H | $P_{12}$ L | $P_{13}$ H | $P_{14}$ L | $P_{15}$ H | $P_{16}$ L | ... | $P_{1m}$ |
| $R_2$ | $P_{21}$ L | $P_{22}$ H | $P_{23}$ L | $P_{24}$ H | $P_{25}$ L | $P_{26}$ H | ... | $P_{2m}$ |
| $R_3$ | $P_{31}$ H | $P_{32}$ L | $P_{33}$ H | $P_{34}$ L | $P_{35}$ H | $P_{36}$ L | ... | $P_{3m}$ |
| $R_4$ | $P_{41}$ L | $P_{42}$ H | $P_{43}$ L | $P_{44}$ H | $P_{45}$ L | $P_{46}$ H | ... | $P_{4m}$ |
| $R_5$ | $P_{51}$ H | $P_{52}$ L | $P_{53}$ H | $P_{54}$ L | $P_{55}$ H | $P_{56}$ L | ... | $P_{5m}$ |
| $R_6$ | $P_{61}$ L | $P_{62}$ H | $P_{63}$ L | $P_{64}$ H | $P_{65}$ L | $P_{66}$ H | ... | $P_{6m}$ |
| ⋮ | ⋮ | ⋮ | ⋮ | ⋮ | ⋮ | ⋮ | ... | ⋮ |
| $R_n$ | Pn1 | Pn2 | Pn3 | Pn4 | Pn5 | Pn6 | ... | Pnm |

|  | $C_1$ | $C_2$ | $C_3$ | $C_4$ | $C_5$ | $C_6$ | ... | $C_m$ |
|---|---|---|---|---|---|---|---|---|
| $R_1$ | $P_{11}$ L | $P_{12}$ H | $P_{13}$ L | $P_{14}$ H | $P_{15}$ L | $P_{16}$ H | ... | $P_{1m}$ |
| $R_2$ | $P_{21}$ L | $P_{22}$ H | $P_{23}$ L | $P_{24}$ H | $P_{25}$ L | $P_{26}$ H | ... | $P_{2m}$ |
| $R_3$ | $P_{31}$ L | $P_{32}$ H | $P_{33}$ L | $P_{34}$ H | $P_{35}$ L | $P_{36}$ H | ... | $P_{3m}$ |
| $R_4$ | $P_{41}$ L | $P_{42}$ H | $P_{43}$ L | $P_{44}$ H | $P_{45}$ L | $P_{46}$ H | ... | $P_{4m}$ |
| $R_5$ | $P_{51}$ L | $P_{52}$ H | $P_{53}$ L | $P_{54}$ H | $P_{55}$ L | $P_{56}$ H | ... | $P_{5m}$ |
| $R_6$ | $P_{61}$ L | $P_{62}$ H | $P_{63}$ L | $P_{64}$ H | $P_{65}$ L | $P_{66}$ H | ... | $P_{6m}$ |
| ⋮ | ⋮ | ⋮ | ⋮ | ⋮ | ⋮ | ⋮ | ... | ⋮ |
| $R_n$ | $P_{n1}$ | $P_{n2}$ | $P_{n3}$ | $P_{n4}$ | $P_{n5}$ | $P_{n6}$ | ... | $P_{nm}$ |

| | $C_1$ | $C_2$ | $C_3$ | $C_4$ | $C_5$ | $C_6$ | ... | $C_m$ |
|---|---|---|---|---|---|---|---|---|
| $R_1$ | $P_{11}$ L | $P_{12}$ L | $P_{13}$ L | $P_{14}$ L | $P_{15}$ L | $P_{16}$ L | ... | $P_{1m}$ |
| $R_2$ | $P_{21}$ H | $P_{22}$ H | $P_{23}$ H | $P_{24}$ H | $P_{25}$ H | $P_{26}$ H | ... | $P_{2m}$ |
| $R_3$ | $P_{31}$ L | $P_{32}$ L | $P_{33}$ L | $P_{34}$ L | $P_{35}$ L | $P_{36}$ L | ... | $P_{3m}$ |
| $R_4$ | $P_{41}$ H | $P_{42}$ H | $P_{43}$ H | $P_{44}$ H | $P_{45}$ H | $P_{46}$ H | ... | $P_{4m}$ |
| $R_5$ | $P_{51}$ L | $P_{52}$ L | $P_{53}$ L | $P_{54}$ L | $P_{55}$ L | $P_{56}$ L | ... | $P_{5m}$ |
| $R_6$ | $P_{61}$ H | $P_{62}$ H | $P_{63}$ H | $P_{64}$ H | $P_{65}$ H | $P_{66}$ H | ... | $P_{6m}$ |
| : | : | : | : | : | : | : | ... | : |
| $R_n$ | $P_{n1}$ | $P_{n2}$ | $P_{n3}$ | $P_{n4}$ | $P_{n5}$ | $P_{n6}$ | ... | $P_{nm}$ |

|  | $C_1$ | $C_2$ | $C_3$ | $C_4$ | $C_5$ | $C_6$ | ... | $C_m$ |
|---|---|---|---|---|---|---|---|---|
| $R_1$ | $P_{11}$ L | $P_{12}$ L | $P_{13}$ H | $P_{14}$ H | $P_{15}$ L | $P_{16}$ L | ... | $P_{1m}$ |
| $R_2$ | $P_{21}$ L | $P_{22}$ L | $P_{23}$ H | $P_{24}$ H | $P_{25}$ L | $P_{26}$ L | ... | $P_{2m}$ |
| $R_3$ | $P_{31}$ H | $P_{32}$ H | $P_{33}$ L | $P_{34}$ L | $P_{35}$ H | $P_{36}$ H | ... | $P_{3m}$ |
| $R_4$ | $P_{41}$ H | $P_{42}$ H | $P_{43}$ L | $P_{44}$ L | $P_{45}$ H | $P_{46}$ H | ... | $P_{4m}$ |
| $R_5$ | $P_{51}$ L | $P_{52}$ L | $P_{53}$ H | $P_{54}$ H | $P_{55}$ L | $P_{56}$ L | ... | $P_{5m}$ |
| $R_6$ | $P_{61}$ L | $P_{62}$ L | $P_{63}$ H | $P_{64}$ H | $P_{65}$ L | $P_{66}$ L | ... | $P_{6m}$ |
| ⋮ | ⋮ | ⋮ | ⋮ | ⋮ | ⋮ | ⋮ | ... | ⋮ |
| $R_n$ | Pn1 | Pn2 | Pn3 | Pn4 | Pn5 | Pn6 | ... | Pnm |

101, 102, 100

IMAGE PROCESSING APPARATUS AND INTERPOLATION METHOD OPERABLE TO CALCULATE A LUMINANCE AND INTERPOLATE COLOR BY ADJUSTING A SIGNAL OUTPUT FROM AT LEAST ONE LOW-LUMINANCE PIXEL AND AT LEAST ONE HIGH-LUMINANCE PIXEL

CROSS-REFERENCE TO RELATED APPLICATIONS

This application claims priority under 35 U.S.C. §119(a) from Korean Patent Application No. 10-2011-0067980 filed on Jul. 8, 2011, the disclosure of which is hereby incorporated by reference in its entirety.

BACKGROUND

With the high integration of charge-coupled devices (CCDs) and complementary metal-oxide semiconductors (CMOS) and the rapid development of image processing technology, the digital camera market has rapidly expanded and it is becoming common to provide one or more digital camera functions to mobile devices, such as portable phones and personal digital assistants (PDAs), among others.

An image processing apparatus may capture the image of an object using an image sensor such as a CCD or a CMOS.

An image sensor may use a conventional RGB Bayer pattern pixel array as shown in FIG. 1. The image sensor may include a plurality of pixels converting a light signal of an object into an electrical signal. Each pixel in the image sensor using the pixel array shown in FIG. 1 detects one of R, G and B values.

The R, G or B value detected by each pixel is converted into a digital signal by an analog-to-digital converter (ADC) included in the image sensor. The digital signal is input to an image signal processor (ISP).

The actual color of the object can be represented by the combination of R, G and B. Data detected by each pixel in the image sensor may include information about only one of the R, G and B data. Generally, the ISP carries out color interpolation using the R, G and B data detected by pixels so that each pixel can include information about all of the R, G and B data.

As described above, the ISP processes data output from the image sensor into signals that can be displayed in the form of an image in a display device (e.g., a liquid crystal display (LCD)).

However, a white spot phenomenon and dark current is not considered important when luminance is high. Additionally, the saturation level of pixels is not considered important when luminance is low. Therefore, it is desired to provide a pixel array optimal to current luminance by changing the composition of pixels.

SUMMARY

According to some embodiments of the inventive concept, an image sensor includes a pixel array including a plurality of pixels and a converter that is operable to convert an analog image signal that is output from the pixel array into a digital image signal.

The plurality of pixels includes at least one low-luminance pixel that comprising a first photoelectric conversion device that accumulates a charge corresponding to a first charge value that is less than a predetermined reference value and at least one high-luminance pixel that comprising a second photoelectric conversion device that accumulates a charge corresponding to a second charge value that is greater than the predetermined reference value.

In some embodiments, the low-luminance pixel and the high-luminance pixel are alternately arranged in the pixel array. Some embodiments provide that the low-luminance pixel corresponds to a first color and the high-luminance pixel corresponds to a second color that is different from the first color. In some embodiments, the first color is at least one color among red, green and blue and the second color is at least one color among red, green and blue that is different from the first color.

Some embodiments provide that when the pixel array is formed using a plurality of Bayer pattern blocks, each Bayer pattern block comprises either the low-luminance pixel or the high-luminance pixel.

In some embodiments, the low-luminance pixel is arranged in a first column of the pixel array and the high-luminance pixel is arranged in a second column of the pixel array and the first column and the second column are alternately arranged in the pixel array. Some embodiments provide that the low-luminance pixel is arranged in a first row of the pixel array and the high-luminance pixel is arranged in a second row of the pixel array and the first row and the second row are alternately arranged in the pixel array.

Some embodiments include an image processing apparatus that includes the image sensor disclosed herein. In some embodiments, the apparatus includes an image signal processor that is operable to control an operation of the image sensor.

In some embodiments, the image signal processor is further operable to calculate a luminance and interpolate color by adjusting the amount of a signal output from the low-luminance pixel and the amount of a signal output from the high-luminance pixel based on the calculated luminance. Some embodiments provide that the image signal processor is further operable to interpolate the color by detecting the signal output from the low-luminance pixel more than the signal output from the high-luminance pixel when the calculated luminance is less than the predetermined value.

Some embodiments provide that the image signal processor interpolates the color by detecting the signal output from the high-luminance pixel more than the signal output from the low-luminance pixel when the calculated luminance is more than the predetermined value.

Some embodiments of the present inventive concept include interpolation methods of an image processing apparatus. Such methods may include arranging a low-luminance pixel comprising a first photoelectric conversion device that accumulates a charge less than a predetermined reference value and a high-luminance pixel comprising a second photoelectric conversion device that accumulates a charge more than the predetermined reference value in an image sensor. Methods may include calculating a luminance and interpolating color by adjusting an amount of a signal output from the low-luminance pixel and an amount of a signal output from the high-luminance pixel based on the calculated luminance.

In some embodiments, arranging the low-luminance pixel and the high-luminance pixel comprises alternately arranging the low-luminance pixel and the high-luminance pixel in the pixel array. Some embodiments provide that the pixel array is formed using a plurality of Bayer pattern blocks and that arranging the low-luminance pixel and the high-luminance pixel comprising arranging the low-luminance pixel and the high-luminance pixel so that each Bayer pattern block has either the low-luminance pixel or the high-luminance pixel.

In some embodiments, arranging the low-luminance pixel and the high-luminance pixel comprises arranging the low-luminance pixel in a first column of the image sensor and the high-luminance pixel in a second column of the image sensor and alternately arranging the first column and the second column in the image sensor. Some embodiments provide that arranging the low-luminance pixel and the high-luminance pixel comprises arranging the low-luminance pixel in a first row of the pixel array and the high-luminance pixel in a second row of the pixel array and alternately arranging the first row and the second row in the pixel array.

In some embodiments, calculating a luminance and interpolating color comprises interpolating the color by detecting the signal output from the low-luminance pixel more than the signal output from the high-luminance pixel when the calculated luminance is less than a predetermined value. Some embodiments provide that calculating a luminance and interpolating color comprises interpolating the color by detecting the signal output from the high-luminance pixel more than the signal output from the low-luminance pixel when the calculated luminance is less than a predetermined value.

Some embodiments of the present inventive are directed to an image processing apparatus that includes an image sensor. The image sensor may include a pixel array comprising a plurality of pixels and a converter configured to convert an analog image signal output from the pixel array into a digital image signal. In some embodiments, the plurality of pixels comprise at least one low-luminance pixel comprising a first photoelectric conversion device that accumulates a charge less than a predetermined reference value and at least one high-luminance pixel comprising a second photoelectric conversion device that accumulates a charge more than the predetermined reference value. In some embodiments, the apparatus includes an image signal processor that is operable to control an operation of the image sensor.

It is noted that aspects of the invention described with respect to one embodiment, may be incorporated in a different embodiment although not specifically described relative thereto. That is, all embodiments and/or features of any embodiment can be combined in any way and/or combination. These and other objects and/or aspects of the present invention are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

FIG. 1 is a diagram of a conventional RGB Bayer pattern.

FIGS. 5A through 7 are schematic diagrams of a pixel array according to some embodiments of the inventive concept.

DETAILED DESCRIPTION

Figure 2:
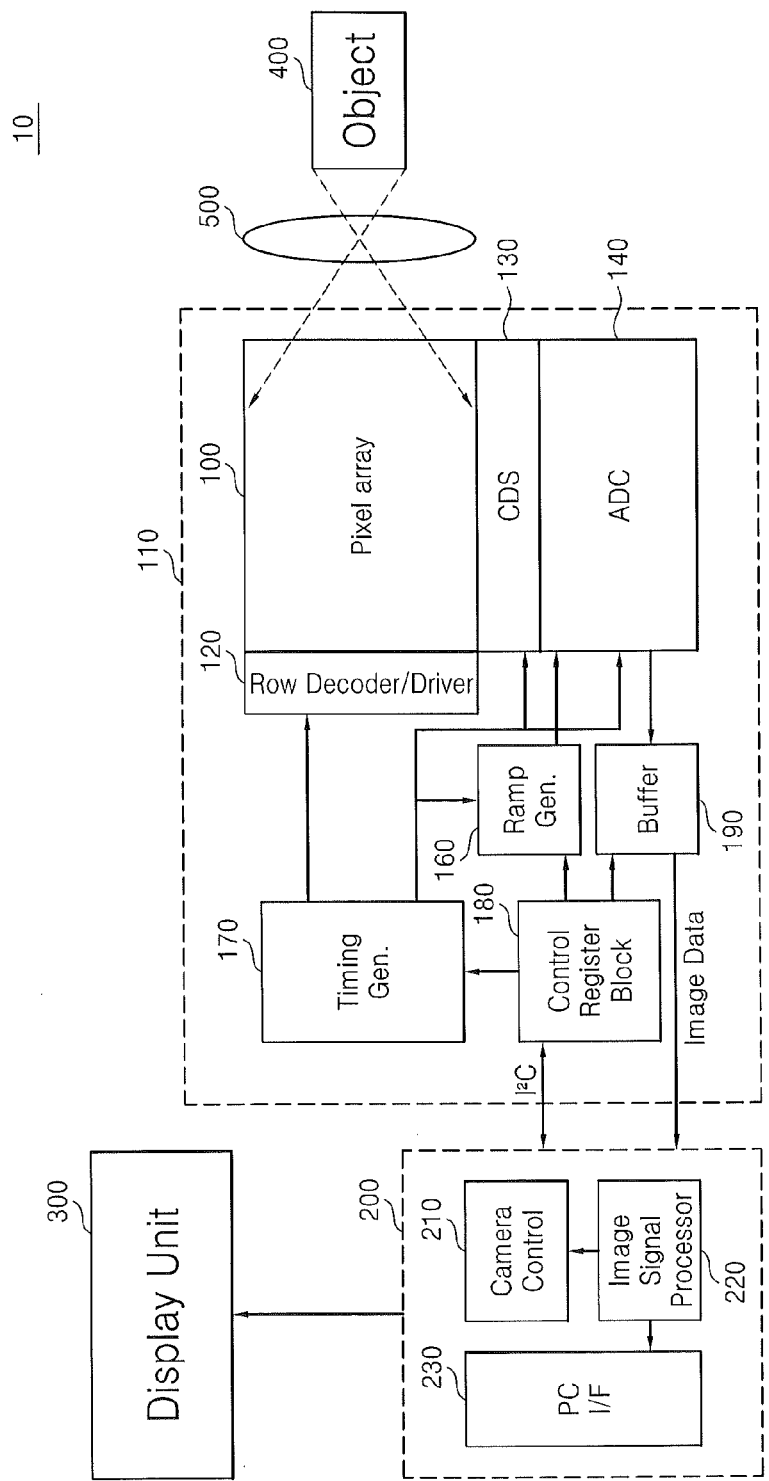
FIG. 2 is a block diagram of an image processing apparatus according to some embodiments of the inventive concept.

The present inventive concept now will be described more fully hereinafter with reference to the accompanying drawings, in which embodiments of the inventive concept are shown. However, this inventive concept should not be construed as limited to the embodiments set forth herein. Rather, these embodiments are provided so that this disclosure will be thorough and complete, and will fully convey the scope of the inventive concept to those skilled in the art.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present invention. In addition, as used herein, the singular forms "a", "an" and "the" are intended to include the plural forms as well, unless the context clearly indicates otherwise. It also will be understood that, as used herein, the term "comprising" or "comprises" is open-ended, and includes one or more stated elements, steps and/or functions without precluding one or more unstated elements, steps and/or functions. The term "and/or" includes any and all combinations of one or more of the associated listed items.

It will also be understood that when an element is referred to as being "connected" to another element, it can be directly connected to the other element or intervening elements may be present. In contrast, when an element is referred to as being "directly connected" to another element, there are no intervening elements present. It will also be understood that the sizes and relative orientations of the illustrated elements are not shown to scale, and in some instances they have been exaggerated for purposes of explanation.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

It should be construed that forgoing general illustrations and following detailed descriptions are exemplified and an additional explanation of claimed inventive concepts is provided.

Reference numerals are indicated in detail in some embodiments of the present inventive concept, and their examples are represented in reference drawings. Throughout the drawings, like reference numerals are used for referring to the same or similar elements in the description and drawings.

In some embodiments of the inventive concept, an image sensor may be a charge-coupled device (CCD) and/or a complementary metal-oxide semiconductor (CMOS) image sensor (CIS). The CCD may have less noise and higher picture quality than the CIS, but may require higher voltage and higher manufacturing cost than the CIS. The CIS may use an easy driving scheme and can be implemented using various scanning methods. The CIS may allow a signal processing circuit to be integrated into a single chip, thereby decreasing the size of products. In addition, the CIS may be manufactured using CMOS processes, thereby reducing the manufacturing cost. Since the power consumption of the CIS may be very low, the CIS may be easily used in products with limited battery capacity. Hereinafter, examples are provided using the CIS as an image sensor in embodiments of the inventive concept, but the technical ideas of the inventive concept can also be applied to the CCD.

As used herein the term "pixel" may be used to represent a component and/or group of components that are configured to provide an output corresponding to a picture element of an image.

FIG. 2 is a block diagram of an image processing apparatus 10 according to some embodiments of the inventive concept. Referring to FIG. 2, the image processing apparatus 10 may include an image sensor 110 and an image processor 200. Some embodiments provide that the image sensor 110 and the image processor 200 may be implemented in separate chips and/or modules, respectively.

The image sensor 110 may generate an image signal corresponding to an object 400 based on incident light. The image sensor 110 may include a pixel array 100, a row decoder/driver 120, a correlated double sampling (CDS) block 130, an analog-to-digital converter (ADC) 140, a ramp generator 160, a timing generator 170, a control register block 180, and a buffer 190.

The image sensor 110 may be controlled by the image processor 200 to sense the object 400 captured through a lens 500 and output an image of the object 400. The image processor 200 may transmit the image to a display unit 300. Some embodiments provide that the display unit 300 may be any device that can output the image and/or a portion thereof. For instance, the display unit 300 may be a computer, a portable phone, and/or any type of image display terminal and/or device.

The image processor 200 includes a camera control 210, an image signal processor 220, and a personal computer (PC) interface (I/F) 230.

The camera control 210 controls the control register block 180. The camera control 210 may control the image sensor 110, and more specifically, the control register block 180 using an inter-integrated circuit ($I^2C$), but the scope of the inventive concept is not restricted thereto.

The image signal processor 220 receives image data, i.e., an output signal of the buffer 190, processes the image data into an image, and outputs the image to the display unit 300 through PC I/F 230.

Although the image signal processor 220 is provided within the image processor 200 in the embodiments illustrated in FIG. 2, the design may be changed by those of skilled in the art. For instance, the image signal processor 220 may be positioned within the image sensor 110, among others.

The pixel array 100 includes a plurality of photoelectric conversion devices such as photo diodes and/or pinned photo diodes, among others. The pixel array 100 senses light using the photoelectric conversion devices and converts the light into an electrical signal to generate an image signal.

The pixel array 100 includes a plurality of pixels. The pixels may include a plurality of low-luminance pixels (hereinafter, referred to as low-luminance pixels), which include a first photoelectric conversion device that is operable to accumulate a charge less than a predetermined reference value, and a plurality of high-luminance pixels (hereinafter, referred to as high-luminance pixels), which include a second photoelectric conversion device that is operable to accumulate a charge greater than the predetermined reference value.

In contrast with conventional pixels that may have the same saturation level, some embodiments of the inventive concept are directed to the pixel array 100 that may include pixels respectively including photoelectric conversion devices having different saturation levels.

The saturation level of a photoelectric conversion device may be in a trade-off relationship versus a white spot phenomenon and dark current. In other words, when the saturation level is improved, the white spot phenomenon and the dark current may be worsened. In order to improve the white spot phenomenon and the dark current as well as the saturation level, a photoelectric conversion device having characteristics fitting with an environment may be used.

For instance, in a low luminance environment, the probability that a photoelectric conversion device is saturated may be low since the light is not bright. Accordingly, reducing the white spot phenomenon and dark current may be more important than increasing the saturation level of the photoelectric conversion device.

In contrast, in a high-luminance environment with bright light, the probability that the photoelectric conversion device is saturated is high while a probability of observing the white spot phenomenon and dark current may be low. In other words, in the high-luminance environment the saturation level of the photoelectric conversion device may be a dominant factor.

Accordingly, the pixel array 100 includes a plurality of pixels including a plurality of high-luminance pixels equipped with the second photoelectric conversion device that accumulates more charge than conventional pixels and a plurality of low-luminance pixels equipped with the first photoelectric conversion device that accumulates less charge than the conventional pixels.

Some embodiments provide that the low-luminance pixel may be at least one pixel among the plurality of pixels having different colors and the high-luminance pixel may be a pixel other than the low-luminance pixel.

For instance, when the pixels have red, green and blue colors, low-luminance pixels may be located at positions having red and blue while a high-luminance pixel is located at a position having green (i.e, a color other than red and blue.) This is described below with reference to FIGS. 5A and 5B later.

When the pixel array 100 includes a plurality of basic pixel blocks in a Bayer pattern, high-luminance pixels and low-luminance pixels may be arranged by blocks. This is described below with reference to FIG. 7.

Some embodiments provide that low-luminance pixels may be the pixels in a first column of the pixel array 100 while high-luminance pixels may be the pixels in a second column of the pixel array 100. The first column and the second column may be alternately arranged in the pixel array 100. In some embodiments, low-luminance pixels may be the pixels in a first row of the pixel array 100 while high-luminance pixels may be the pixels in a second row of the pixel array 100. The first row and the second row may be alternately arranged in the pixel array 100. This is described below with reference to FIGS. 6A and 6B.

The timing generator 170 may output a control signal to the row decoder/driver 120, the ADC 140, and the ramp generator 160 to control the operations of the row decoder/driver 120, the ADC 140, and the ramp generator 160. The control register block 180 may output a control signal to the ramp generator 160, the timing generator 170, and the buffer 190 to control the operations of the elements 160, 170, and 190. The control register block 180 is controlled by the camera control 210.

The row decoder/driver 120 drives the pixel array 100 in units of rows. For instance, the row decoder/driver 120 may generate a row select signal. The pixel array 100 outputs to the CDS block 130 a reset signal and an image signal from a row selected by the row select signal received from the row decoder/driver 120. The CDS block 130 may perform CDS on the reset signal and/or the image signal.

The ADC 140 compares a ramp signal output from the ramp generator 160 with a CDS signal output from the CDS block 130, generates a comparison result signal, counts the comparison result signal, and outputs a count result to the buffer 190.

The buffer 190 temporarily stores a digital signal output from the ADC 130 and senses and amplifies the digital signal before outputting it. The buffer 190 may include a plurality of column memory blocks (e.g., static random access memories (SRAMs)) provided for respective columns for temporal storing and/or a sense amplifier sensing and amplifying the digital signal received from the ADC 130.

The image signal processor 220 calculates luminance according to the brightness of light in an external environment and carries out interpolation in which a low-luminance pixel is given more weight when the calculated luminance is less than a predetermined value.

In other words, the image signal processor 220 interpolates color by adjusting the amount of a signal output from a low-luminance pixel and the amount of a signal output from a high-luminance pixel. In the interpolation, when the calculated luminance is less than the predetermined value, the image signal processor 220 detects and/or weights the signal output from the low-luminance pixel more than the signal output from the high-luminance pixel.

When the calculated luminance is greater than the predetermined value, the image signal processor 220 detects and/or weights the signal output from the high-luminance pixel more than the signal output from the low-luminance pixel in the interpolation.

Accordingly, the pixel array 100 may realize higher signal-to-noise ratio (SNR) than conventional pixel arrays.

Figure 3A:
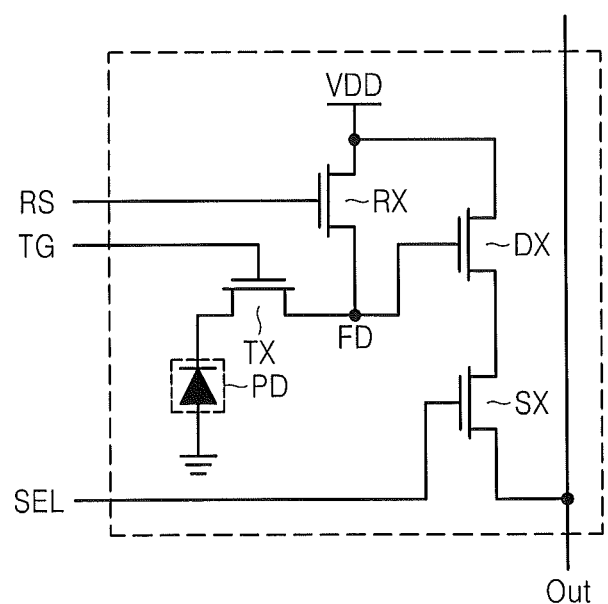
FIGS. 3A through 3D are circuit diagrams of a unit pixel included in an image sensor according to some embodiments of the inventive concept.

FIGS. 3A through 3D are circuit diagrams of a unit pixel included in an image sensor according to some embodiments of the inventive concept. Referring to FIG. 3A, the unit pixel may include a photoelectric conversion device PD, a transfer transistor TX, a floating diffusion node FD, a reset transistor RX, a drive transistor (or a source follower transistor) DX, and a select transistor SX.

The photoelectric conversion device PD receives light energy emitted from a light emitting source and generates and accumulates photocharges. According to some embodiments of the inventive concept, the photoelectric conversion device PD illustrated in FIGS. 3A through 3D may be the second photoelectric conversion device that accumulates more charges than conventional photoelectric conversion devices and thus may be included in a high-luminance pixel suitable to a high-luminance environment in which saturation speed is high.

The photoelectric conversion device PD illustrated in FIGS. 3A through 3D may also be the first photoelectric conversion device that accumulates less charges than conventional photoelectric conversion devices. Stated differently, the first photoelectric conversion device may accumulate less charge than the second photoelectric conversion device under similar luminance conditions. The first photoelectric conversion device may be included in a low-luminance pixel suitable to a low-luminance environment in which saturation does not occur. The transfer transistor TX transmits a charge (or photocurrent) accumulated at the photoelectric conversion device PD to the floating diffusion node FD in response to a transfer control signal TG.

The floating diffusion node FD is formed by a floating diffusion region and receives and stores the photocharge from the photoelectric conversion device PD through the transfer transistor TX.

The reset transistor RX is connected between a power supply voltage VDD and the floating diffusion node FD and resets the floating diffusion node FD to the power supply voltage VDD in response to a reset signal RS.

The drive transistor DX is connected between the power supply voltage VDD and a first node and causes the first node to source-follow the power supply voltage VDD based on the charge at the floating diffusion node FD.

The select transistor SX is connected to the first node and an output node and forms an electrical path between the first node and the output node in response to a select signal SEL.

Each of a plurality of pixels in a column may output pixel signals (e.g., a reset signal and an image signal) in response to a plurality of control signals (e.g., TG, RS and SEL illustrated in FIG. 3A) generated by the row decoder/driver 120.

FIG. 3A shows a pixel including a single photoelectric conversion device PD and four MOS transistors TX, RX, DX and SX, but the inventive concept is not restricted to this example. Any circuits including the photoelectric conversion device PD and at least three transistors including the drive transistor DX and the select transistor SX may be used in some embodiments of the inventive concept. Other examples of a pixel are shown in FIGS. 3B through 3D.

Figure 3B:
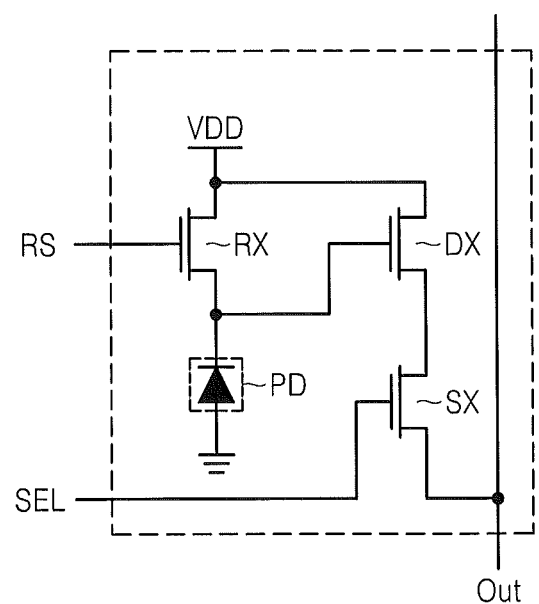

Referring to FIG. 3B, the pixel is a 3-transistor (T) pixel and may include the photoelectric conversion device PD, the reset transistor RX, the drive transistor (or the source follow transistor) DX and the select transistor SX.

Figure 3C:
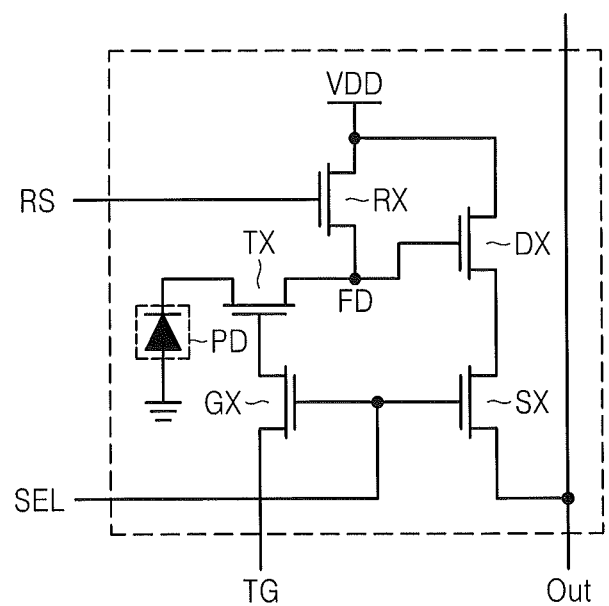

Referring to FIG. 3C, the pixel is a 5T pixel and may include the photoelectric conversion device PD, the reset transistor RX, the drive transistor (or the source follow transistor) DX, the select transistor SX, and two more transistors GX and TX.

Figure 3D:
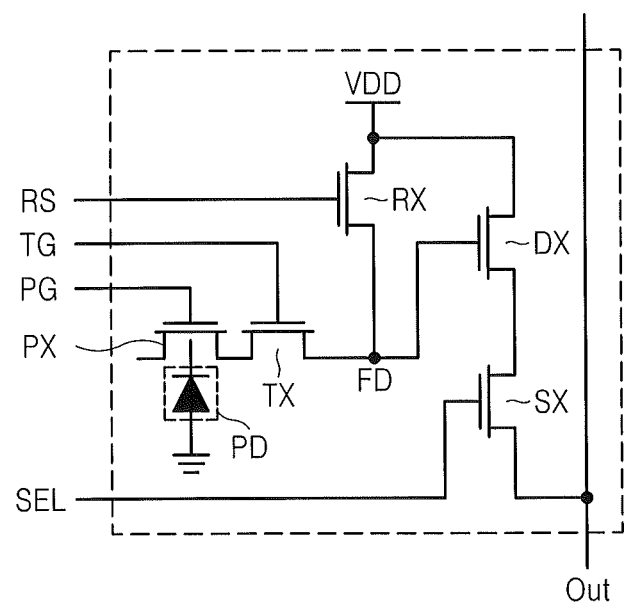

Referring to FIG. 3D, the pixel is another 5T pixel and may include the photoelectric conversion device PD, the reset transistor RX, the drive transistor (or the source follow transistor) DX, the select transistor SX, and two more transistors PX and TX.

Pixels having various structures as shown in FIGS. 3A through 3D may be constructed independently from each other or may share at least one element with each other. For instance, in the structure shown in FIG. 3A, two or four pixels may independently include only the photoelectric conversion device PD and the transfer transistor TX and share the other elements with one another and they may operate independently according to timing control.

Figure 4A:
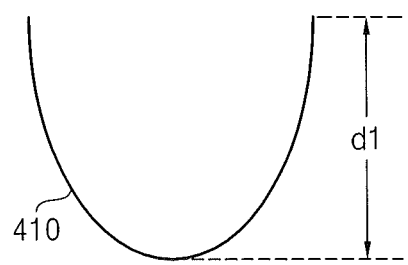
FIGS. 4A through 4C are schematic diagrams showing the relative charge accumulation capacities of a photoelectric conversion device included in an image sensor according to some embodiments of the inventive concept.
Figure 4B:
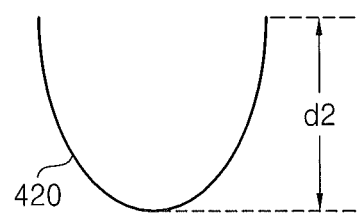
Figure 4C:
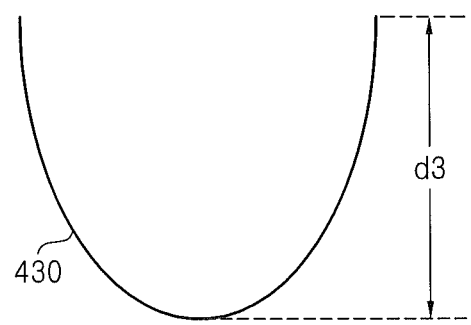

FIGS. 4A through 4C are schematic diagrams showing the relative charge accumulation capacities of a photoelectric conversion device included in an image sensor according to some embodiments of the inventive concept.

In FIGS. 4A through 4C, the capacities are roughly and relatively illustrated to be compared. The size and the shape illustrated in FIGS. 4A through 4C do not restrict the scope of the inventive concept.

FIG. 4A shows the charge accumulation capacity of a conventional photoelectric conversion device 410 with a medium saturation level (having an effective depth of d1). FIG. 4B shows the charge accumulation capacity of a photoelectric conversion device 420 included in a low-luminance pixel according to some embodiments of the inventive concept. As illustrated the charge accumulation capacity has an effective depth of d2 which is less than d1. FIG. 4C shows the charge accumulation capacity (having an effective depth of d3) of a photoelectric conversion device 430 included in a high-luminance pixel according to some embodiments of the inventive concept. As illustrated the charge accumulation capacity has an effective depth of d3 which is greater than d1.

When the charge accumulation capacity is increased, the saturation level can be increased. In other words, since a photoelectric conversion device can accommodate a lot of photocharges generated from light, the photoelectric conversion device is not saturated even at high luminance. In contrast, when the charge accumulation capacity is decreased, the saturation level can be decreased. In other words, since the photoelectric conversion device accumulates a small amount of photocharges, it may be suitable to an environment, such as a low-luminance environment, in which the photoelectric conversion device cannot be saturated.

Consequently, the charge accumulation capacity of a photoelectric conversion device corresponds to the saturation characteristic thereof.

The charge accumulation capacity of a photoelectric conversion device can be adjusted by the number of impurities with which the photoelectric conversion device PD is doped in a unit area. In other words, the effective depth of the photoelectric conversion device can be adjusted depending on the doping amount. The effective depth is the depth d1, d2 or d3 of a place where photocharges are accumulated in the photoelectric conversion device.

In detail, the photoelectric conversion device may be formed by implanting ions in the top of a semiconductor substrate with an energy of about 2 to 3 micro electron volts (eV). The effective depth of the photoelectric conversion device can be adjusted by adjusting the amount of the implanted ions by adjusting the amount of the energy.

Some embodiments provide that the charge accumulation capacity, the saturation level and the effective depth can be adjusted by adjusting the area of ion-implantation. The area of ion-implantation can be adjusted by adjusting the area of photoresist during implantation.

FIGS. 5A through 7 are schematic diagrams of the pixel array 100 according to some embodiments of the inventive concept.

As shown in FIGS. 5A through 7, the pixel array 100 may include a plurality of pixels $P_{11}, P_{12}, \ldots, P_{nm}$ connected with a plurality of row lines $R_1$ through $R_n$ and a plurality of column lines $C_1$ through $C_m$ in the form of a two-dimensional matrix.

Each of the pixels $P_{11}$ through $P_{nm}$ in the pixel array 100 may include a color filter transmitting light in a particular spectrum. The color filter may be a red (R) filter, a green (G) filter, a blue (B) filter, a white (W) filter, a yellow (Y) filter, a magenta (Mg) filter, a cyan (Cy) filter and/or a black (BL) filter, among others.

The pixel array 100 may include a plurality of 2*2 basic pixel blocks repeatedly arranged in the vertical and horizontal directions. Each basic pixel block includes a low-luminance pixel L and a high-luminance pixel H which are sequentially arranged in the first row line $R_1$ and a high-luminance pixel H and a low-luminance pixel L which are sequentially arranged in the second row line $R_2$. The basic pixel block may be repeatedly arranged.

Here, referring to FIGS. 1 and 5A, the low-luminance pixels are green pixels and the high-luminance pixels are red and blue pixels, but the inventive concept is not restricted thereto. In some embodiments, as illustrated in FIG. 5B, the pixel array 100 includes a high-luminance pixel H and a low-luminance pixel L which are sequentially arranged in the first row line $R_1$ and a low-luminance pixel L and a high-luminance pixel H which are sequentially arranged in the second row line $R_2$. Here, referring to FIGS. 1 and 5B, the low-luminance pixels are red and blue pixels and the high-luminance pixels are green pixels.

The pixel array 100 may have one of the patterns illustrated in FIGS. 5A through 7, but the inventive concept is not restricted thereto. For example, the pixel array 100 may formed in various other patterns such as 2*2, 3*3 or 4*4 mosaic and/or striped patterns including R, G, B, Mg, Cy, Y, BL and/or W pixels.

Referring to FIG. 6A, the pixel array 100 may include low-luminance pixels L arranged in odd-numbered column lines $C_1, C_3, C_5, \ldots$ and high-luminance pixels H arranged in even-numbered column lines $C_2, C_4, C_6, \ldots$. In some embodiments, high-luminance pixels H may be arranged in the odd-numbered column lines $C_1, C_3, C_5, \ldots$ and low-luminance pixels L may be arranged in the even-numbered column lines $C_2, C_4, C_6, \ldots$.

Referring to FIG. 6B, the pixel array 100 may include low-luminance pixels L arranged in odd-numbered row lines $R_1, R_3, R_5, \ldots$ and high-luminance pixels H arranged in even-numbered row lines $R_2, R_4, R_6 \ldots$. In some embodiments, high-luminance pixels H may be arranged in the odd-numbered column lines $R_1, R_3, R_5, \ldots$ and low-luminance pixels L may be arranged in the even-numbered column lines $R_2, R_4, R_6, \ldots$.

Referring to FIG. 7, the pixel array 100 may include a plurality of 2*2 basic pixel blocks 101 and 102 repeatedly arranged in the vertical and horizontal directions. Each of the basic pixel blocks 101 and 102 may include low-luminance pixels L only or high-luminance pixels H only.

In the embodiments illustrated in FIG. 7, the basic pixel block 101 includes low-luminance pixels L only while the basic pixel block 102 includes high luminance pixels H only, but the inventive concept is not restricted to the current embodiments.

Various embodiments of the inventive concept that are not illustrated in FIGS. 5A through 7 are within the scope and spirit of the inventive concept. As such the examples illustrated in the drawings are non-limiting.

When generating an image, the image signal processor 220 illustrated in FIG. 2 may interpolate the signal of each pixel, giving more weight to the low-luminance pixel L in the low-luminance environment using the arrangement of the pixel array 100 illustrated in any one of FIGS. 5A through 7.

In the high-luminance environment, the image signal processor 220 may interpolate the signal of each pixel, giving more weight to the high-luminance pixels.

The interpolation may be linear interpolation and/or non-linear interpolation. An interpolation block including a target pixel of the interpolation and adjacent pixels of the target pixel may be formed. The size of the interpolation block (i.e., the number of pixels included in the interpolation block) or the shape (a square, rectangular, line or diamond shape) thereof may be changed freely.

Accordingly, a pixel structure according to some embodiments of the inventive concept provides a higher SNR than conventional pixel structures.

Figure 8:
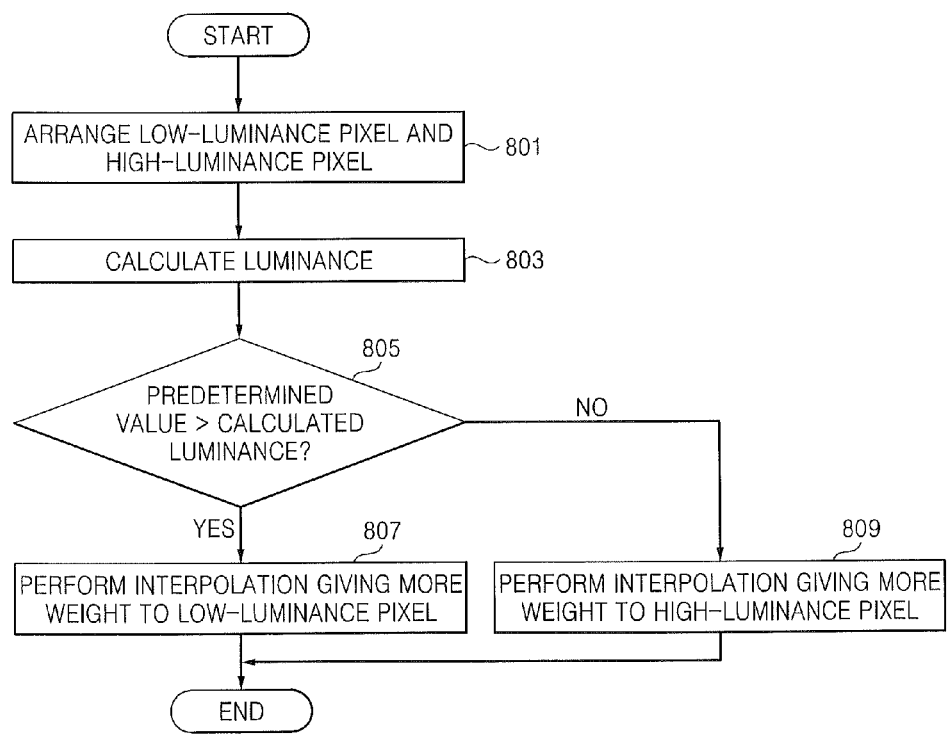
FIG. 8 is a flowchart of an interpolation method of an image processing apparatus according to some embodiments of the inventive concept.

FIG. 8 is a flowchart of illustrating operation for interpolation methods of the image processing apparatus 10 according to some embodiments of the inventive concept.

A low-luminance pixel which includes a first photoelectric conversion device accumulating a charge less than a predetermined reference value and a high-luminance pixel which includes a second photoelectric conversion device accumulating a charge greater than the predetermined reference value are arranged in a pixel array (block 801). The arrangement can be performed using various methods which have been described with reference to FIGS. 5A through 7.

The reference value may be set differently depending on the usage of a photoelectric conversion device.

The image signal processor 220 calculates the external luminance of the image processing apparatus 10 (block 803). The calculated luminance is compared with a predetermined value (block 805). When the predetermined value is greater than the calculated luminance, the low-luminance pixel is given more weight in interpolation (block 807). When the predetermined value is less than the calculated luminance, the high-luminance pixel is given more weight in the interpolation (block 809).

Figure 9:
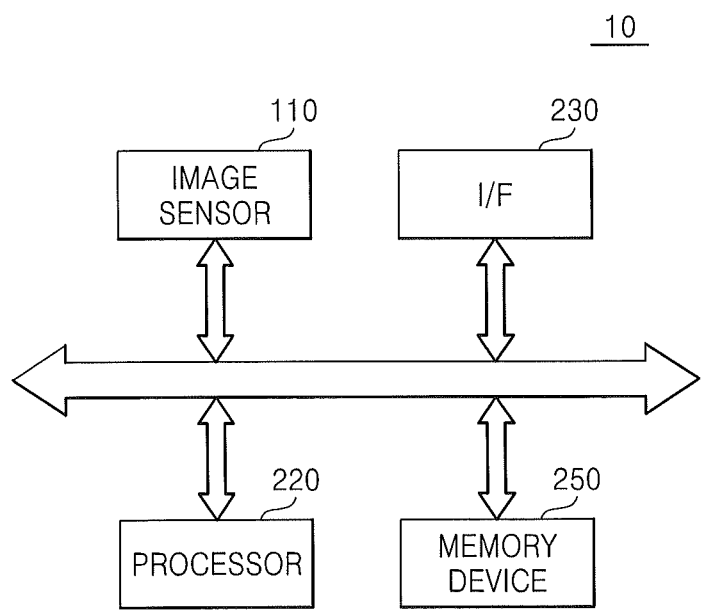
FIG. 9 is a schematic block diagram of the image processing apparatus illustrated in FIG. 2.

FIG. 9 is a schematic block diagram of the image processing apparatus 10 illustrated in FIG. 2.

The image processing apparatus 10 may be a digital camera, a cellular phone with an embedded digital camera and/or any electronic apparatus including a digital camera.

The image processing apparatus 10 may process two- and/or three-dimensional image information. The image processing apparatus 10 includes an image sensor 110 according to some embodiments of the inventive concept. The processor 220 may control one or more operations of the image sensor 110.

The image processing apparatus 10 may also include the interface 230. The interface 230 may be an image display device and/or an input/output device.

The image display device may include a memory device 250 that stores a still and/or moving image captured by the image sensor 110 under the control of the processor 220. The memory device 250 may be implemented by a non-volatile memory device. The non-volatile memory device may include a plurality of non-volatile memory cells.

The non-volatile memory may be EEPROM(Electrically Erasable Programmable Read-Only Memory), flash memory, magnetic RAM (MRAM), Spin-Transfer Torque MRAM, Conductive bridging RAM(CBRAM), Ferroelectric RAM (FeRAM), Phase change RAM(PRAM) which may be called Ovonic Unified Memory(OUM), Resistive RAM(RRAM or ReRAM), Nanotube RRAM, Polymer RAM(PoRAM), Nano Floating Gate Memory(NFGM), holographic memory, Molecular Electronics Memory, and/or Insulator Resistance Change Memory, among others.

As described above, according to some embodiments of the inventive concept, a low-luminance pixel and a high-luminance pixel which respectively include photoelectric conversion devices having different saturation levels are provided. Interpolation is carried out giving more weight to the low-luminance pixel at low luminance and giving more weight to the high-luminance pixel at high luminance, so that the better SNR is obtained than in conventional pixel structure.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. An image processing apparatus comprising:
    an image sensor comprising:
        a pixel array comprising a plurality of pixels; and
        a converter configured to convert an analog image signal that is output from the pixel array into a digital image signal,
        wherein the plurality of pixels includes at least one low-luminance pixel comprising a first photoelectric conversion device that accumulates a charge corresponding to a first charge value that is less than a predetermined reference value and at least one high-luminance pixel comprising a second photoelectric conversion device that accumulates a charge corresponding to a second charge value that is greater than the predetermined reference value; and
    an image signal processor that is operable to control an operation of the image sensor,
    wherein the image signal processor is further operable to calculate a luminance and interpolate color by adjusting the amount of a signal output from the low-luminance pixel and the amount of a signal output from the high-luminance pixel based on the calculated luminance.

2. The apparatus according to claim 1, wherein the low-luminance pixel and the high-luminance pixel are alternately arranged in the pixel array.

3. The apparatus according to claim 1, wherein the low-luminance pixel corresponds to a first color and the high-luminance pixel corresponds to a second color that is different from the first color.

4. The apparatus according to claim 3, wherein the first color is at least one color among red, green and blue and the second color is at least one color among red, green and blue that is different from the first color.

5. The apparatus according to claim 1, wherein when the pixel array is formed using a plurality of Bayer pattern blocks, and wherein each Bayer pattern block comprises either the low-luminance pixel or the high-luminance pixel.

6. The apparatus according to claim 1, wherein the low-luminance pixel is arranged in a first column of the pixel array and the high-luminance pixel is arranged in a second column of the pixel array and the first column and the second column are alternately arranged in the pixel array.

7. The apparatus according to claim 1, wherein the low-luminance pixel is arranged in a first row of the pixel array and the high-luminance pixel is arranged in a second row of the pixel array and the first row and the second row are alternately arranged in the pixel array.

8. The apparatus according to claim 1, wherein the image signal processor is further operable to interpolate the color by detecting the signal output from the low-luminance pixel more than the signal output from the high-luminance pixel when the calculated luminance is less than a predetermined value.

9. The apparatus according to claim 1, wherein the image signal processor further interpolates the color by detecting the signal output from the high-luminance pixel more than the signal output from the low-luminance pixel when the calculated luminance is more than a predetermined value.

10. An interpolation method of an image processing apparatus, the interpolation method comprising:
    arranging a low-luminance pixel comprising a first photoelectric conversion device that accumulates a charge less than a predetermined reference value and a high-luminance pixel comprising a second photoelectric conversion device that accumulates a charge more than the predetermined reference value in an image sensor; and
    calculating a luminance and interpolating color by adjusting an amount of a signal output from the low-luminance pixel and an amount of a signal output from the high-luminance pixel based on the calculated luminance.

11. The method according to claim 10, wherein arranging the low-luminance pixel and the high-luminance pixel comprises alternately arranging the low-luminance pixel and the high-luminance pixel in the pixel array.

12. The method according to claim 10, wherein the pixel array is formed using a plurality of Bayer pattern blocks, and wherein arranging the low-luminance pixel and the high-luminance pixel comprising arranging the low-luminance pixel and the high-luminance pixel so that each Bayer pattern block has either the low-luminance pixel or the high-luminance pixel.

13. The method according to claim 10, wherein arranging the low-luminance pixel and the high-luminance pixel comprises arranging the low-luminance pixel in a first column of the image sensor and the high-luminance pixel in a second column of the image sensor and alternately arranging the first column and the second column in the image sensor.

14. The method according to claim 10, wherein arranging the low-luminance pixel and the high-luminance pixel comprises arranging the low-luminance pixel in a first row of the pixel array and the high-luminance pixel in a second row of the pixel array and alternately arranging the first row and the second row in the pixel array.

15. The method according to claim 10, wherein calculating a luminance and interpolating color comprises interpolating the color by detecting the signal output from the low-luminance pixel more than the signal output from the high-luminance pixel when the calculated luminance is less than a predetermined value.

16. The method according to claim 10, wherein calculating a luminance and interpolating color comprises interpolating the color by detecting the signal output from the high-luminance pixel more than the signal output from the low-luminance pixel when the calculated luminance is greater than a predetermined value.

17. An image processing apparatus comprising:
an image sensor comprising:
  a pixel array comprising a plurality of pixels; and
  a converter configured to convert an analog image signal output from the pixel array into a digital image signal,
  wherein the plurality of pixels comprise at least one low-luminance pixel comprising a first photoelectric conversion device that accumulates a charge less than a predetermined reference value and at least one high-luminance pixel comprising a second photoelectric conversion device that accumulates a charge more than the predetermined reference value; and
an image signal processor that is operable to control an operation of the image sensor,
wherein the image signal processor is further operable to interpolate color by detecting a signal output from the low-luminance pixel more than a signal output from the high-luminance pixel when a calculated luminance is less than a predetermined value or to interpolate the color by detecting the signal output from the high-luminance pixel more than the signal output from the low-luminance pixel when the calculated luminance is more than the predetermined value.

18. The image processing apparatus according to claim 17, wherein the low-luminance pixel is arranged in a first row of the pixel array and the high-luminance pixel is arranged in a second row of the pixel array and the first row and the second row are alternately arranged in the pixel array.

* * * * *